United States Patent
Ramrattan et al.

(10) Patent No.: US 8,730,657 B2
(45) Date of Patent: May 20, 2014

(54) MOBILE COMPUTING DEVICES

(75) Inventors: Colin Shiva Ramrattan, Waterloo (CA); Mohamad El-Hage, Cambridge (CA)

(73) Assignee: BlackBerry Limited, Waterloo, Ontario (CA)

( * ) Notice: Subject to any disclaimer, the term of this patent is extended or adjusted under 35 U.S.C. 154(b) by 383 days.

(21) Appl. No.: 13/167,913

(22) Filed: Jun. 24, 2011

(65) Prior Publication Data

US 2012/0327048 A1 Dec. 27, 2012

(51) Int. Cl.
*G06F 1/16* (2006.01)

(52) U.S. Cl.
USPC .................. 361/679.21; 345/179; 455/572

(58) Field of Classification Search
USPC ........... 345/204, 87, 211, 179, 173, 156, 502, 345/690, 89, 633; 455/566, 41.2, 41.1, 455/343.1, 572, 115.3, 343.2, 11.1, 7, 455/569.1; 385/14; 361/694, 695, 696, 749, 361/679.21, 679.22, 679.26, 679.27, 361/679.01, 679.08, 679.47, 679.58, 679.41
See application file for complete search history.

(56) References Cited

U.S. PATENT DOCUMENTS

| | | | |
|---|---|---|---|
| 6,307,751 B1 | 10/2001 | Bodony et al. | |
| 6,350,944 B1 | 2/2002 | Sherif et al. | |
| 6,885,032 B2 | 4/2005 | Forbes et al. | |
| 7,602,366 B2 | 10/2009 | Aoki et al. | |
| 7,715,200 B2 | 5/2010 | Cho et al. | |
| 7,721,238 B2 | 5/2010 | Rogers et al. | |
| 7,809,220 B2 * | 10/2010 | Kim et al. | 385/14 |
| 2002/0007884 A1 | 1/2002 | Schuster et al. | |
| 2002/0061692 A1 | 5/2002 | Steckmann et al. | |
| 2004/0108504 A1 | 6/2004 | Forbes et al. | |
| 2004/0110326 A1 | 6/2004 | Forbes et al. | |
| 2006/0050475 A1 | 3/2006 | Chen | |
| 2007/0042660 A1 | 2/2007 | Waxler | |
| 2007/0049068 A1 | 3/2007 | Yanagida | |
| 2007/0229469 A1 | 10/2007 | Seguine | |
| 2007/0229470 A1 | 10/2007 | Snyder et al. | |

(Continued)

FOREIGN PATENT DOCUMENTS

| | | |
|---|---|---|
| DE | 3302857 A1 | 8/1984 |
| JP | 4053292 A | 2/1992 |

(Continued)

OTHER PUBLICATIONS

Schwesig et al., "Gummi: A Bendable Computer," CHI 2004, Apr. 2004, Vienna, Austria, vol. 6, No. 1, pp. 263-270 (8 pages).

(Continued)

*Primary Examiner* — Hung Duong
(74) *Attorney, Agent, or Firm* — Finnegan, Henderson, Farabow, Garrett & Dunner LLP

(57) ABSTRACT

A mobile computing device includes a flexible display, a rigid-flex printed circuit board (PCB) arrangement, an electrically conductive memory fabric, and a controller. The rigid-flex PCB arrangement is connected to the flexible display, and has a honeycomb configuration. The electrically conductive memory fabric is connected to the flexible display and the rigid-flex PCB arrangement. The controller is configured to, by selectively controlling supply of electrical current to the electrically conductive memory fabric, control whether the electrically conductive memory fabric (i) straightens and resists flexing of the flexible display and the rigid-flex PCB arrangement or (ii) is relaxed and allows flexing of the flexible display and the rigid-flex PCB arrangement.

17 Claims, 5 Drawing Sheets

(56) References Cited

U.S. PATENT DOCUMENTS

| | | | |
|---|---|---|---|
| 2008/0150905 | A1 | 6/2008 | Grivna et al. |
| 2008/0179112 | A1 | 7/2008 | Qin et al. |
| 2009/0267931 | A1 | 10/2009 | Aoki et al. |
| 2010/0175916 | A1 | 7/2010 | Rogers et al. |
| 2010/0265671 | A1* | 10/2010 | Tsai et al. ............... 361/749 |
| 2010/0317409 | A1* | 12/2010 | Jiang et al. .............. 455/566 |
| 2013/0082984 | A1* | 4/2013 | Drzaic et al. ............. 345/204 |

FOREIGN PATENT DOCUMENTS

| | | | |
|---|---|---|---|
| JP | 2001210917 | A | 8/2001 |
| JP | 2004178425 | A | 6/2004 |
| JP | 2008016555 | A | 1/2008 |

OTHER PUBLICATIONS

"Kyocera's flexible, folding phone concept," posted Apr. 14, 2009, available at http://www.core77.com/blog/objectculture/kyoceras_flexible_folding_phone_concept_13184.asp (last visited Apr. 14, 2011) (3 pages).

"Cambridge, Nokia introduce new stretchable and flexible mobile phone concept," available at www.physorg.com/news123167268.html, (last visited Apr. 14, 2011) (2 pages).

"Rollable display—Wikipedia, the free encyclopedia," available at http://en.wikipedia.org/wiki/Rollable_display (last visited Jun. 28, 2011) (1 page).

Stacey Higginbotham, "Is There a Rollable Display in Your Future?," May 26, 2010, available at http://gigaom.com/2010/05/26/is-there-a-rollable-display-in-your-future/ (last visited Jun. 28, 2011) (6 pages).

"Sony develops a rollable OLED screen," available at http://www.youtube.com/watch?v=90vTLg4i2_U (last visited Jun. 28, 2011) (2 pages).

Matthew Humphries, May 26, 2010, "Sony demonstrates rollable OLED," available at http://www.geek.com/articles/mobile/sony-demonstrates-rollable-oled-20100526/ (last visited Jun. 28, 2011) (10 pages).

"Orkin Design rolltop—laptop with rollable touchscreen," available at http://www.techchee.com/2009/11/02/orkin-design-rolltop-laptop-with-rollable-touchscreen/ (last visited Jun. 28, 2011) (2 pages).

"Nitinol wire," available at http://www.youtube.com/watch?v=Y7jjqXh7bB4 (last visited Jun. 28, 2011) (2 pages).

"Nitinol Hot Wire," available at http://www.grand-illusions.com/acatalog/Hot_Wire.html (last visited Jun. 28, 2011) (2 pages).

"MuscleWires.com—featuring all-electric Motorless Motion!," available at http://web.archive.org/web/20080705031503/http://www.mondotronics.com/shapememoryalloys.shtml (last visited Jun. 28, 2011) (3 pages).

Dynalloy, Inc. "Introduction to Flexinol(R)," available at http://www.dynalloy.com/AboutFlexinol.html (last visited Jun. 28, 2011) (1 page).

"Shape memory polymer—Wikipedia, the free encyclopedia," available at http://en.wikipedia.org/wiki/Shape_memory_polymer (last visited Jun. 28, 2011) (9 pages).

"Future Designer laptop—Rolltop //Diploma Thesis", Jul. 10, 2010, available at http://pritecho.com/2010/07/future-designer-laptop-rolltop-diploma-thesis/ (last visited Jun. 30, 2011) (4 pages).

"OLED displays built on thin flexible metal foil," Oct. 19, 2010, available at http://www.printedelectronicsworld.com/articles/oled-displays-built-on-thin-flexible-metal-foil-00002716.asp?sessionid=1 (last visited Jun. 28, 2011) (2 pages).

* cited by examiner

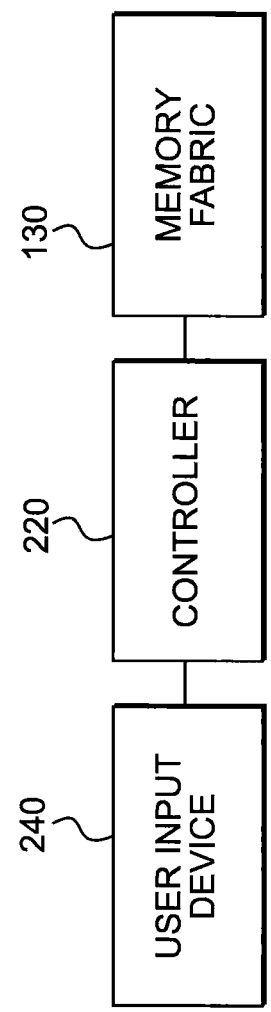

MOBILE COMPUTING DEVICES

FIELD

This disclosure relates generally to computing devices and, more particularly, to mobile computing devices.

BACKGROUND INFORMATION

Mobile computing devices such as, for example, e-Readers, tablet computers, mobile phones, and personal digital assistants are becoming increasingly useful. With this increased usefulness, many users of mobile computing devices now prefer to carry the mobile computing devices in place of magazines, newspapers, or paperback books.

Unfortunately, unlike magazines, newspapers, and paperback books, most of which may be bent, rolled, or folded for easy carriage or storage, conventional mobile computing devices have a rigid structure. Thus, users of conventional mobile computing devices sometimes might find it inconvenient to carry or store the mobile computing devices.

BRIEF DESCRIPTION OF THE DRAWINGS

The accompanying drawings, which are incorporated in and constitute a part of this specification, illustrate several embodiments and, together with the description, serve to explain the disclosed principles. In the drawings.

FIG. 6 is a control diagram consistent with disclosed embodiments.

DETAILED DESCRIPTION

Figure 1:
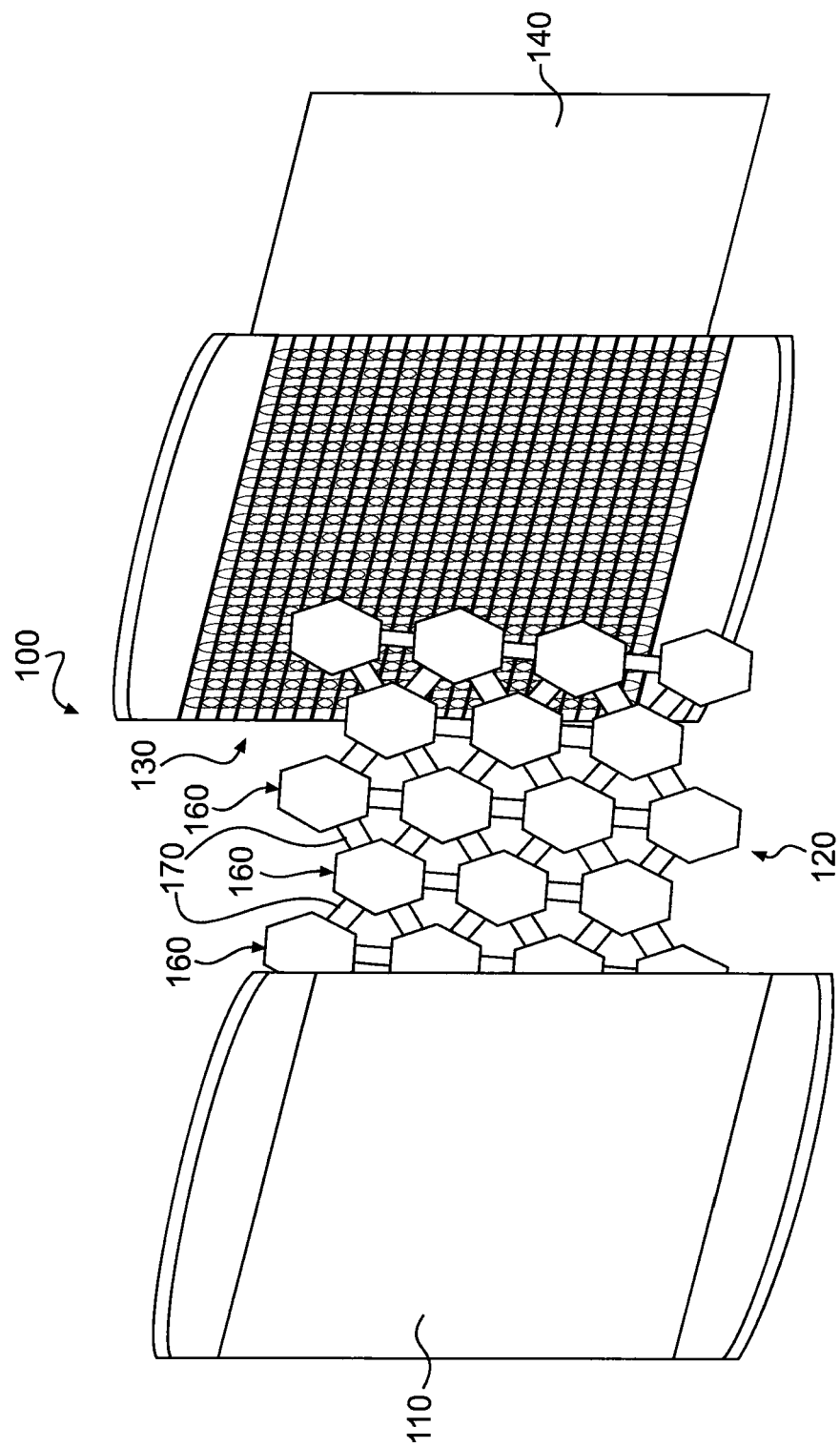
FIG. 1 is an exploded view of a computing device consistent with disclosed embodiments.

Reference will now be made in detail to exemplary embodiments, examples of which are illustrated throughout the drawings. Wherever possible, the same reference numbers are used in the drawings and the description to refer to the same or like parts.

As illustrated in FIG. 1, an exemplary mobile computing device 100 includes a flexible display 110; a printed circuit board (PCB) arrangement 120; an electrically conductive memory fabric 130; and a flexible cover 140, which is formed of fabric, plastic, or another flexible material, and protects electrically conductive memory fabric 130. For example, device 100 may be an e-Reader, a tablet computer, a mobile phone, a personal digital assistant, or another type of mobile computing device.

While flexible display 110, PCB arrangement 120, and flexible cover 140 generally allow flexing of device 100, memory fabric 130 selectively (i) straightens and resists flexing of device 100, or (ii) relaxes and allows flexing of device 100. In particular, when electrical current is supplied to memory fabric 130, memory fabric 130 straightens and resists flexing of flexible display 110, PCB arrangement 120, and flexible cover 140. But, when electrical current is not supplied to memory fabric 130, memory fabric 130 relaxes and allows flexing of flexible display 110, PCB arrangement 120, and flexible cover 140. Accordingly, it is contemplated that, by controlling whether or not electrical current is supplied to memory fabric 130, it is possible to control whether device 100 is rigid or flexible. For example, when rigid, a user may hold device 100 as if it was a stiff magazine, newspaper, or book, and may view or interact with text or pictures displayed on flexible display 110. In contrast, when flexible, the user may bend, roll, or fold device 100 for easy carriage or storage.

Flexible display 110 includes a flexible organic light-emitting diode (OLED) display, a flexible e-ink display, or another type of flexible display. In some embodiments, flexible display 110 may include a touch panel. For example, the touch panel may be a PET film touch panel. Alternatively the touch panel may be another type of touch panel.

As shown in FIG. 1, PCB arrangement 120 is situated between flexible display 110 and memory fabric 130. Although not illustrated as being connected to flexible display 110 and memory fabric 130 in FIG. 1, it should be understood that, once device 100 is assembled, PCB arrangement 120 is connected to flexible display 110 and memory fabric 130. Further, it should be understood that memory fabric 130 could alternatively be situated between flexible display 110 and PCB arrangement 120.

PCB arrangement 120 is a rigid-flex PCB arrangement. In other words, PCB arrangement 120 includes both rigid and flexible substrates. For example, PCB arrangement 120 includes rigid-flex PCBs 160, which are connected to each other by flexible PCBs 170. As used herein, rigid-flex PCBs are PCBs having both rigid and flexible substrates, and flexible PCBs are PCBs having only flexible substrates. It is contemplated that rigid-flex PCBs 160 and flexible PCBs 170 are both multilayer PCBs. For example, rigid-flex PCBs 160 may be six layer rigid-flex PCBs, and flexible PCBs 170 may be four layer flexible PCBs. Alternatively, rigid-flex PCBs 160 and flexible PCBs 170 may be otherwise layered. For example, rigid-flex PCBs 160 may have fewer than six layers, and flexible PCBs 170 may have fewer than four layers.

Figure 2:
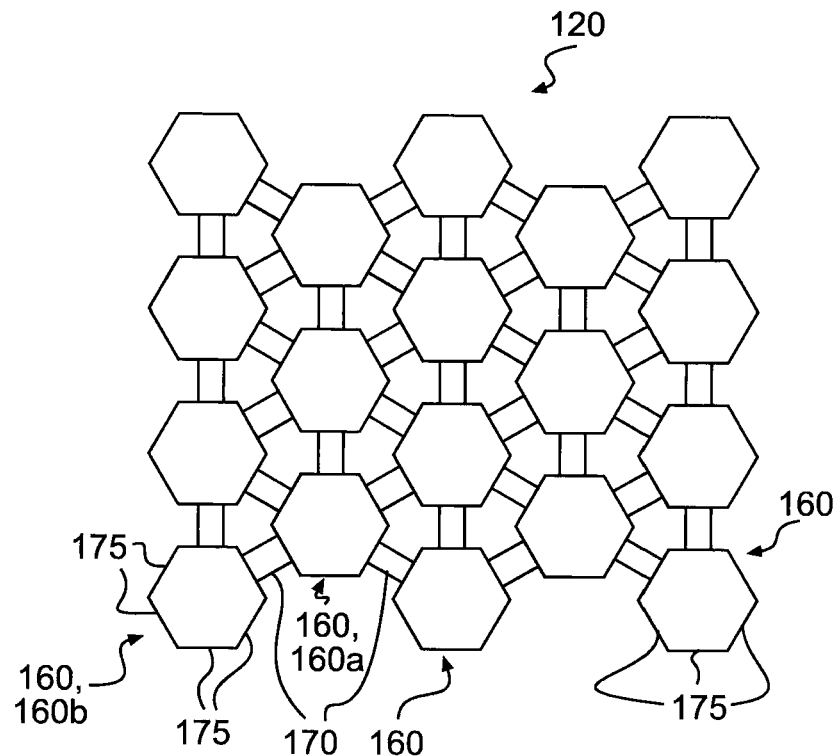
FIG. 2 is a front view of a printed circuit board (PCB) arrangement of the computing device of FIG. 1 consistent with disclosed embodiments.
Figure 3:
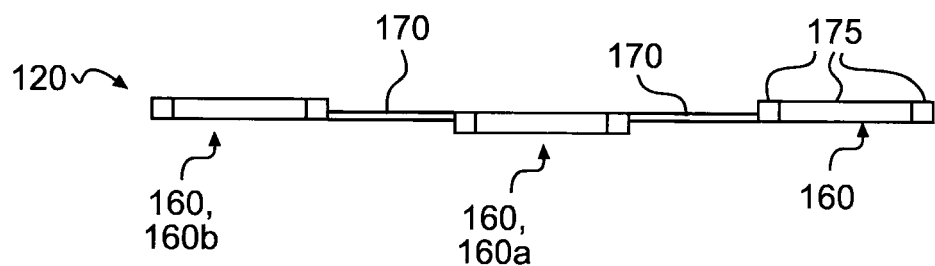
FIG. 3 is a side view of the PCB arrangement of FIG. 2.

Referring to FIGS. 2 and 3, rigid-flex PCBs 160 are approximately hexagon-shaped, and are arranged in a honeycomb configuration. In such a configuration rigid-flex PCBs 160 are approximately evenly spaced from each other and are generally oriented in the same fashion. Thus, at least one approximately planar face 175 of each rigid-flex PCB 160 is approximately parallel to at least one approximately planar face 175 of each other rigid-flex PCB 160. Although it is contemplated that the honeycomb configuration may facilitate flexing of PCB arrangement 120, it should be understood that rigid-flex PCBs 160 may be otherwise arranged. For example, in some embodiments, approximately square-shaped rigid-flex PCBs may be arranged in a grid configuration (i.e., a configuration in which rigid-flex PCBs are aligned to create perpendicular rows and columns).

Again referring to FIGS. 2 and 3, one flexible PCB 170 connects each neighboring pair of rigid-flex PCBs 160 (e.g., rigid-flex PCBs 160a and 160b). For example, as shown in FIG. 3, to facilitate flexing of PCB arrangement 120, one flexible PCB 170 connects an upper layer of rigid-flex PCB 160a to a lower layer of rigid-flex PCB 160b. It should be understood, however, that one flexible PCB 170 may alternatively connect upper layers of two rigid-flex PCBs 160, lower layers of two rigid-flex PCBs 160, or middle layers of two rigid-flex PCBs 160. In yet another alternative, one flexible PCB 170 may connect a middle layer of one rigid-flex PCB 160 to an upper or lower layer of another rigid-flex PCB 160.

As discussed above, once device 100 is assembled, PCB arrangement 120 is connected to flexible display 110 and memory fabric 130. Thus, it should be understood that, once device 100 is assembled, memory fabric 130 is connected to flexible display 110 and PCB arrangement 120.

Figure 4:
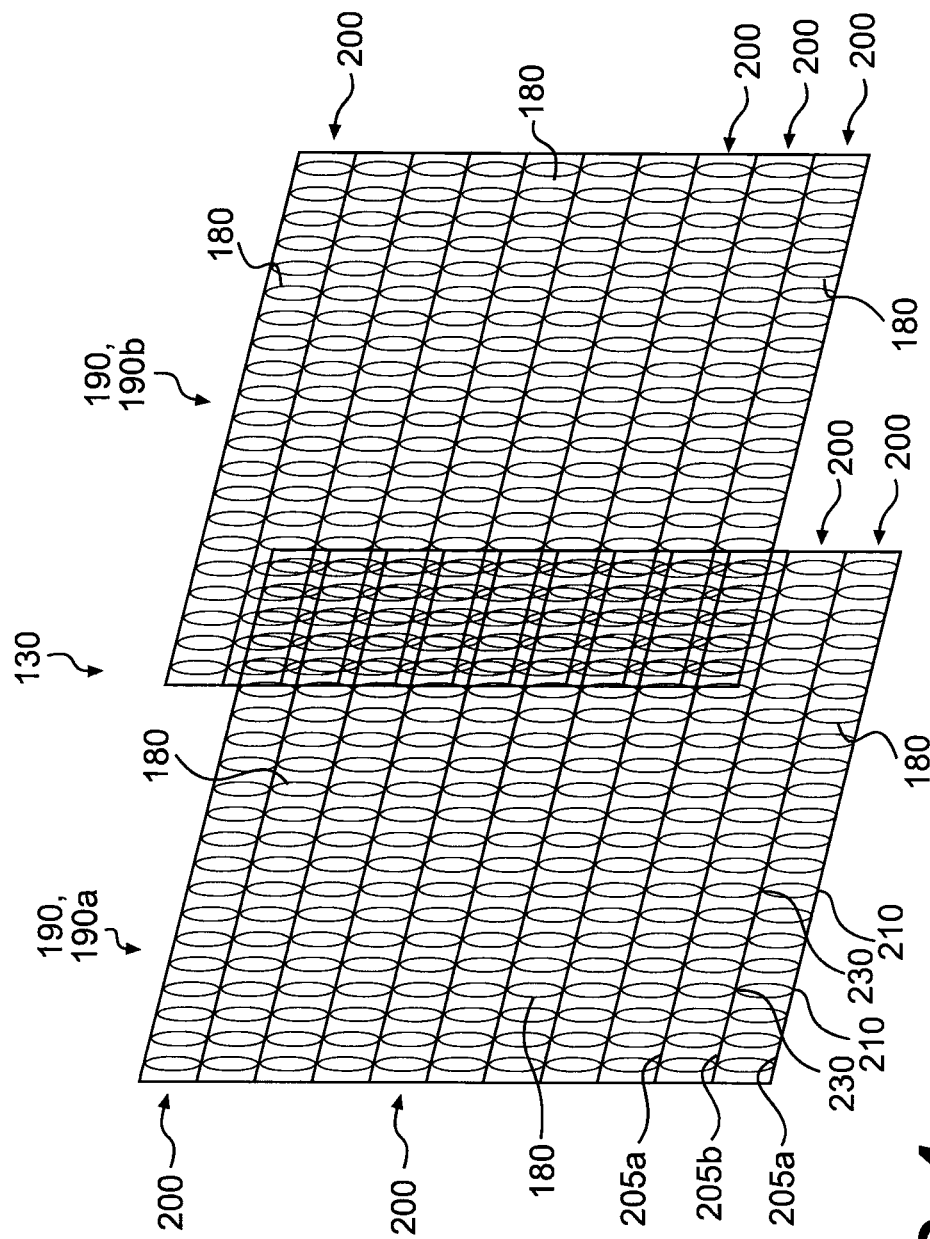
FIG. 4 is an exploded view of a memory fabric of the computing device of FIG. 1 consistent with disclosed embodiments.

As shown in FIG. 4, memory fabric 130 includes a plurality of electrically conductive memory wires 180. For example, memory wires 180 include nitinol wires. Alternatively, memory wires 180 include other shape memory alloy wires. It should be understood that, when supplied with electrical current, memory wires 180 straighten and resist flexing of flexible display 110, PCB arrangement 120, and flexible cover 140. But, when not supplied with electrical current, memory wires 180 relax and allow flexing of flexible display 110, PCB arrangement 120, and flexible cover 140.

It is contemplated that, even when supplied with electrical current, individual memory wires 180 may not be rigid enough to resist flexing of flexible display 110, PCB arrangement 120, and flexible cover 140. Accordingly, as shown in FIG. 4, memory fabric 130 includes a plurality of layers 190 (e.g., layers 190a and 190b) of memory wires 180. Each layer 190, in turn, includes a plurality of rows 200 of memory wires 180. For example, each row 200 includes a pair of electrically conductive connectors 205a and 205b, which, respectively, connect first ends 210 of memory wires 180 to a current source (e.g., a controller 220 (referring to FIG. 6), discussed below) and connect second ends 230 of memory wires 180 to a ground.

In some embodiments of memory fabric 130, such as, for example, the one illustrated in FIGS. 1 and 4, layers 190a and 190b are arranged such that, when electrical current is supplied to memory fabric 130, rows 200 of layer 190a are approximately parallel to and are offset from rows 200 of layer 190b (with the offset being in a direction perpendicular to the length of the rows 200 and parallel to the width of the rows 200). Thus, it should be understood that, in these embodiments, when electrical current is supplied to memory fabric 130, at least one connector 205a of layer 190a is situated between connectors 205a and 205b of a single row 200 of layer 190b. Likewise, it should be understood that, in these embodiments, when electrical current is supplied to memory fabric 130, at least one connector 205b of layer 190a is situated between connectors 205a and 205b of a single row 200 of layer 190b. It should be noted that, in these embodiments, when electrical current is supplied to memory fabric 130, memory wires 180 of both layers 190a and 190b may not resist flexing of flexible display 110, PCB arrangement 120, and flexible cover 140 about axes orthogonal to connectors 205a and 205b. Thus, in these embodiments, connectors 205a and 205b are rigid to resist flexing of device 100 about axes orthogonal to connectors 205a and 205b.

Figure 5:
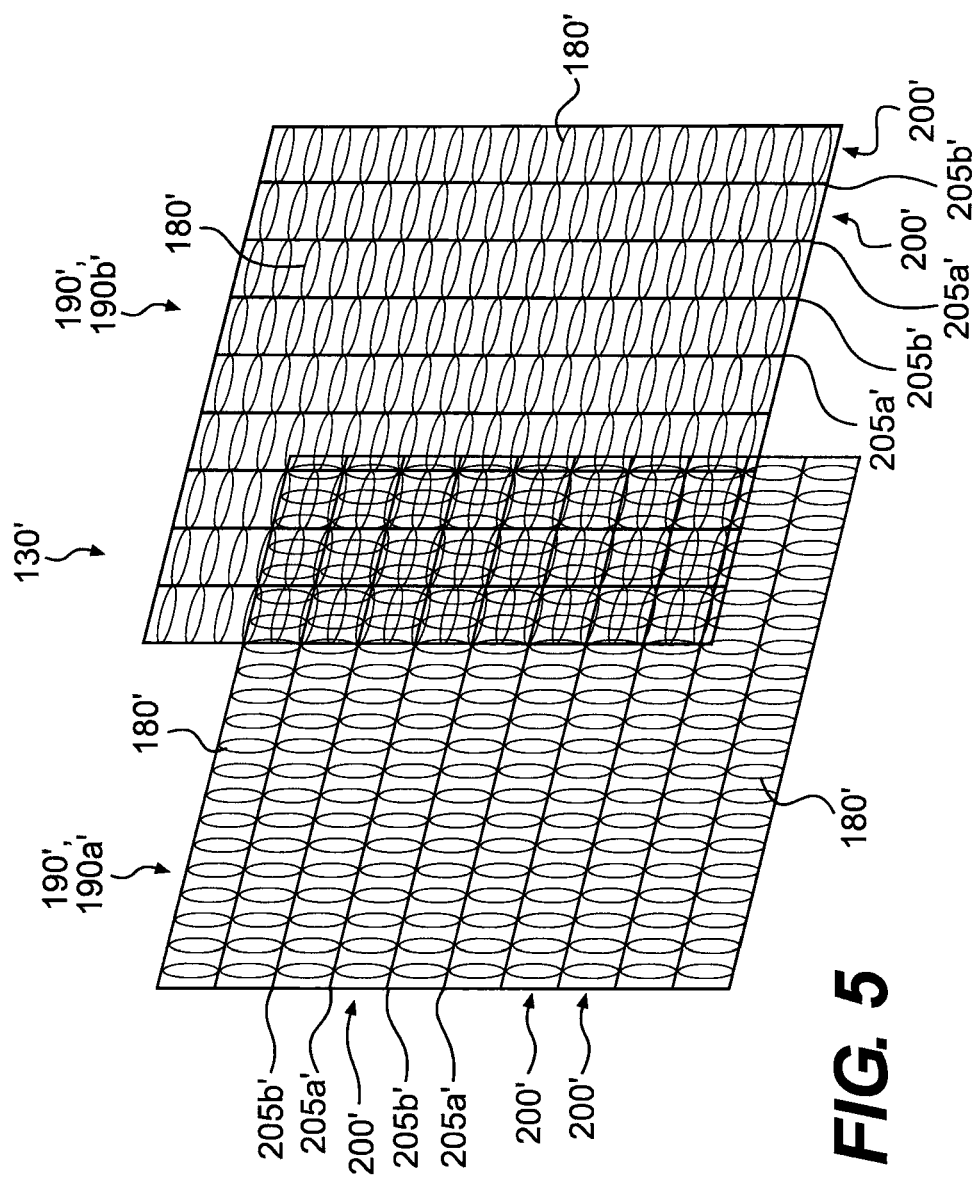
FIG. 5 is an exploded view of another memory fabric consistent with disclosed embodiments.

In other embodiments of memory fabric 130 (hereafter "memory fabric 130'"), such as, for example, the one illustrated in FIG. 5, layers 190a' and 190b' are arranged such that, when electrical current is supplied to memory fabric 130', rows 200' of layer 190a' are approximately perpendicular to rows 200' of layer 190b'. In these embodiments, it is contemplated that, when electrical current is supplied to memory fabric 130', (i) memory wires 180' of layer 190a' may resist flexing of device 100' about axes orthogonal to connectors 205a' and 205b' of layer 190b'; and (ii) memory wires 180' of layer 190b' may resist flexing of device 100' about axes orthogonal to connectors 205a' and 205b' of layer 190a'. Accordingly, in these embodiments, connectors 205a' and 205b' may not be rigid.

As shown in FIG. 6, in order to control whether or not electrical current is supplied to memory fabric 130, device 100 includes a controller 220, which is connected to and in communication with memory fabric 130 and a user input device 240. It is contemplated that, when memory fabric 130 is relaxed and allows flexing of device 100, a user's actuation of input device 240 will cause controller 220 to initiate supply of electrical current to memory fabric 130. Once supplied with electrical current, memory fabric 130 will straighten and resist flexing of device 100. It is contemplated that device 100 will remain rigid until the user again actuates input device 240, causing controller 220 to stop supply of electrical current to memory fabric 130. When no longer supplied with electrical current, memory fabric 130 will relax and again allow flexing of device 100.

Controller 220 is connected to and in communication with memory wires 180 of memory fabric 130 via connectors 205a and 205b of memory fabric 130. For example, controller 220 may be situated on PCB arrangement 120, and may include one or more processors (not shown) and one or more memory devices (not shown). Alternatively, controller 220 may be otherwise situated.

In embodiments of flexible display 110 having a touch panel, input device 240 may be the touch panel. Alternatively, input device 240 may be a switch, a button, a wheel, a joystick, or another user input device capable of receiving a user input. In any case, controller 220 communicates with input device 240 to determine the user's input, and selectively supplies electrical current to memory wires 180 of memory fabric 130, based on the user's input.

It is contemplated that the above-described features of device 100 may individually or in combination benefit device 100's user. For example, because memory fabric 130 can selectively (i) straighten and resist flexing of device 100 or (ii) relax and allow flexing of device 100, it is possible for the user to control whether device 100 is rigid or flexible. When rigid, the user may hold device 100 as if it was a stiff magazine, newspaper, or book, and may view or interact with text or pictures displayed on flexible display 110. In contrast, when flexible, the user may bend, roll, or fold device 100 for easy carriage or storage.

While specific embodiments have been described in detail, it will be appreciated by those skilled in the art that various modifications and alternatives to those details could be developed in light of the overall teachings of the disclosure. Accordingly, the particular arrangements disclosed are meant to be illustrative only and not limiting.

For example, although the above-described embodiments have memory wires 180 including shape memory alloy wires, it will appreciated by those skilled in the art that memory wires 180 could alternatively include shape memory polymer wires. In such alternative configurations, it should be understood that, when not supplied with electrical current, memory wires 180 would straighten and resist flexing, but, when supplied with electrical current, memory wires 180 would relax and allow flexing. Therefore, it is contemplated that the timing of when electric current is or is not supplied to memory fabric 130 may be modified based on the type of memory wires 180.

What is claimed is:

1. A mobile computing device, comprising:
   a flexible display;
   an electrically conductive memory fabric connected to the flexible display; and
   a controller connected to the electrically conductive memory fabric, and configured to, by selectively controlling supply of electrical current to the electrically conductive memory fabric, control whether the electrically conductive memory fabric (i) straightens and resists flexing of the flexible display or (ii) is relaxed and allows flexing of the flexible display,
wherein, the electrically conductive memory fabric includes first and second layers of electrically conductive memory wires.

2. The mobile computing device of claim 1, wherein:
the electrically conductive memory wires includes nitinol wires;
when electrical current is supplied to the electrically conductive memory fabric, the electrically conductive memory fabric straightens and resists flexing of the flexible display; and
when electrical current is not supplied to the electrically conductive memory fabric, the electrically conductive memory fabric is relaxed and allows flexing of the flexible display.

3. The mobile computing device of claim 1, wherein each of the layers of electrically conductive memory wires includes a plurality of rows of electrically conductive memory wires.

4. The mobile computing device of claim 3, wherein:
at least one of the rows includes first and second connectors; and
each of the electrically conductive memory wires of the at least one of the rows includes:
a first end connected to the first connector; and
a second end connected to the second connector.

5. The mobile computing device of claim 4, wherein:
each of the first and second connectors is electrically conductive;
the controller is connected to each of the electrically conductive memory wires of the at least one of the rows via the first and second connectors; and
the controller is configured to selectively supply electrical current to the electrically conductive memory wires of the at least one of the rows via the first connector,
wherein:
when electrical current is supplied to the electrically conductive memory wires of the at least one of the rows, the electrically conductive memory wires of the at least one of the rows straighten and resist flexing of the flexible display; and
when electrical current is not supplied to the electrically conductive memory wires of the at least one of the rows, the electrically conductive memory wires of the at least one of the rows are relaxed and allow flexing of the flexible display.

6. The mobile computing device of claim 4, wherein, when electrical current is supplied to the electrically conductive memory fabric, at least one of the rows of the first layer is approximately parallel to at least one of the rows of the second layer.

7. The mobile computing device of claim 6, wherein the first and second connectors are rigid.

8. The mobile computing device of claim 6, wherein, when electrical current is supplied to the electrically conductive memory fabric, a first connector of the at least one of the rows of the first layer is situated between first and second connectors of the at least one of the rows of the second layer.

9. The mobile computing device of claim 4, wherein, when electrical current is supplied to the electrically conductive memory fabric, at least one of the rows of the first layer is approximately perpendicular to at least one of the rows of the second layer.

10. The mobile computing device of claim 1, comprising a user input device configured to receive a user input, wherein the controller is in communication with the user input device and is configured to selectively supply electrical current to the electrically conductive memory fabric, based on the received user input.

11. The mobile computing device of claim 10, wherein the user input device is a touch panel of the flexible display.

12. A rigid-flex printed circuit board (PCB) arrangement, comprising:
a plurality of approximately hexagon-shaped rigid-flex PCBs; and
a plurality of flexible PCBs, each of the plurality of flexible PCBs connecting at least two of the plurality of approximately hexagon-shaped rigid-flex PCBs to each other,
wherein:
each of the plurality of approximately hexagon-shaped rigid-flex PCBs has multiple layers; and
at least one of the plurality of flexible PCBs connects an upper layer of one of the plurality of approximately hexagon-shaped rigid-flex PCBs to a lower layer of another of the plurality of approximately hexagon-shaped rigid-flex PCBs.

13. The rigid-flex PCB arrangement of claim 12, wherein the plurality of approximately hexagon-shaped rigid-flex PCBs are arranged such that at least one approximately planar face of a first one of the plurality of approximately hexagon-shaped rigid-flex PCBs is approximately parallel to at least one approximately planar face of a second one of the plurality of approximately hexagon-shaped rigid-flex PCBs.

14. The rigid-flex PCB arrangement of claim 12, wherein the plurality of approximately hexagon-shaped rigid-flex PCBs are arranged in a honeycomb configuration.

15. The rigid-flex PCB arrangement of claim 12, wherein each of the plurality of approximately hexagon-shaped rigid-flex PCBs is a six layer rigid-flex PCB.

16. The rigid-flex PCB arrangement of claim 12, wherein each of the plurality of flexible PCBs is a four layer flexible PCB.

17. A mobile computing device, comprising:
a flexible display;
a rigid-flex printed circuit board (PCB) arrangement connected to the flexible display, and having a honeycomb configuration;
an electrically conductive memory fabric connected to the flexible display and the rigid-flex PCB arrangement; and
a controller configured to selectively supply electrical current to the electrically conductive memory fabric,
wherein:
when electrical current is supplied to the electrically conductive memory fabric, the electrically conductive memory fabric straightens and resists flexing of the flexible display and the rigid-flex PCB arrangement; and
when electrical current is not supplied to the electrically conductive memory fabric, the electrically conductive memory fabric is relaxed and allows flexing of the flexible display and the rigid-flex PCB arrangement.

* * * * *